United States Patent [19]
Badyal

[11] Patent Number: 5,481,228
[45] Date of Patent: Jan. 2, 1996

[54] METHOD AND APPARATUS FOR CONTROLLING OSCILLATOR DUTY CYCLE

[75] Inventor: Rajeev Badyal, Fort Collins, Colo.

[73] Assignee: Hewlett-Packard Corporation, Palo Alto, Calif.

[21] Appl. No.: 138,276

[22] Filed: Oct. 15, 1993

[51] Int. Cl.[6] .................................................. H03B 5/36
[52] U.S. Cl. ................ 331/74; 331/116 R; 331/116 FE; 331/158; 331/175; 329/175; 329/291
[58] Field of Search ................ 331/74, 158, 116 R, 331/116 FE, 108 C, 175, 34, 117 FE, 185, 186, 57; 307/265; 327/175, 291

[56] References Cited

U.S. PATENT DOCUMENTS

| | | | |
|---|---|---|---|
| 3,979,693 | 9/1976 | Saari | 331/61 |
| 4,065,728 | 12/1977 | Saari | 331/75 |
| 4,095,165 | 6/1978 | Boros | 323/17 |
| 4,152,675 | 5/1979 | Jett, Jr. | 331/116 R |
| 4,292,604 | 9/1981 | Embree et al. | 331/111 |
| 4,383,224 | 5/1983 | Saari | 331/74 |
| 4,491,691 | 1/1985 | Embree et al. | 179/84 |
| 4,567,333 | 1/1986 | Embree et al. | 179/84 |
| 4,802,080 | 1/1989 | Bossi et al. | 363/75 |
| 4,831,343 | 5/1989 | Baron | 331/116 R |
| 4,853,655 | 8/1989 | Embree et al. | 331/116 |
| 4,887,053 | 12/1989 | Embree et al. | 331/116 |
| 4,903,181 | 2/1990 | Seidel | 363/16 |
| 4,959,557 | 9/1990 | Miller | 307/265 |
| 5,136,264 | 8/1992 | Nardozza | 332/102 |
| 5,142,251 | 8/1992 | Boomer | 331/116 FE |
| 5,339,052 | 8/1994 | Melse | 331/158 X |

FOREIGN PATENT DOCUMENTS

| | | | |
|---|---|---|---|
| 0094704 | 4/1989 | Japan | 331/116 FE |
| 2007450 | 5/1979 | United Kingdom | 331/116 FE |

*Primary Examiner*—Robert J. Pascal
*Assistant Examiner*—Arnold Kinkead

[57] ABSTRACT

A controller circuit adjusts the output signal duty cycle of an oscillator circuit. The controller circuit changes the effective bias voltage of an amplifier in a Pierce oscillator by enabling a sequence of transistor stages. Changes to the amplifier bias voltage proportionally alter the duty cycle of the oscillator output signal. Each transistor stage includes a first and second transistor selectively coupled in parallel with the amplifier. Each transistor in the circuit has smaller process parameters than the amplifier transistors so that the amplifier bias voltage can be incrementally increased or decreased to produce an output signal with a high precision duty cycle.

20 Claims, 5 Drawing Sheets

METHOD AND APPARATUS FOR CONTROLLING OSCILLATOR DUTY CYCLE

BACKGROUND OF THE INVENTION

This invention relates generally to oscillation circuits and more particularly to a system for selecting the duty cycle of a digital voltage signal.

Oscillator circuits are used to generate timing signals that synchronize digital circuitry. One crystal oscillator circuit that uses metal oxide semiconductor (MOS) technology is the Pierce oscillator. Pierce oscillators are well known to those skilled in the art and are described in detail in: "Crystal Oscillator's Using HCMOS ICs", Synetics Data Book 1986. Pierce oscillators are also described in U.S. Pat. No. 4,383,244 to Saari which is hereby incorporated by reference.

The Pierce oscillator generates a repetitive signal from a crystal that is then amplified with an invertor. The invertor generates a clock signal with different digital logic levels for synchronizing digital logic circuitry. The invertor has a large gain to accurately detect small changes in the crystal output voltage. However, with a high gain invertor, it is critical that the transistor circuitry in the invertor be evenly matched to provide clock signals with a consistent duty cycle.

Present oscillators, such as the Pierce oscillator described above, have difficulty providing a consistent duty cycle for different integrated circuit (IC) components. For example, due to process variations, two ICs with the same oscillator circuit design may generate clock signals with different duty cycles. A process mismatch between a first and second FET (typically used to create an invertor) can significantly change the duty cycle of the oscillator circuit output. Thus, minor process variations on different IC wafers or even different IC chips on the same wafer can alter the characteristics of the clock signal.

It is also difficult to effectively modify clock frequencies without also having to recalculate the process parameters for every component in the oscillation circuit. For example, a 16 MHz crystal, known as a fundamental crystal, may have an inherent 50% duty cycle with a given invertor. A 50% duty cycle (50/50 duty cycle) is a signal that is a logic one for the first half of a clock period and logic zero for the second half of the clock period. However, a 32 MHz crystal, known as an overtone crystal, oscillates on the third harmonic. While the 16 MHz crystal may generate the desired 50/50 duty cycle, the 32 MHz crystal may create a different duty cycle with the same amplifier.

In addition, each digital circuit can have varying duty cycle requirements. For example, a first oscillation circuit may require a 50/50 duty cycle while a second circuit may require a 60/40 duty cycle. Having to redesign the oscillator circuit and accordingly the transistor process parameters, such as channel length and channel width, for each required oscillation frequency and duty cycle, increases design time and cost. In addition, due to integrated circuit (IC) process variations, as described above, the oscillator circuit may still not operate as originally designed.

Accordingly, a need remains for an oscillator circuit that provides a clock signal with a consistent duty cycle over a wide range of IC process parameters and operating frequencies.

SUMMARY OF THE INVENTION

It is, therefore, an object of the invention to maintain a consistent clock signal duty cycle for oscillator circuits with varying process parameters.

Another object of the invention is to reduce the time and cost required to change the timing characteristics of an oscillator circuit.

A further object of the invention is to automatically recalibrate a clock signal to correspond with a desired output response.

The invention is a calibration circuit that adjusts the duty cycle of an oscillation circuit. A typical Pierce oscillator circuit includes a crystal that generates a repetitive input signal and an amplifier (e.g., an invertor) that receives the crystal oscillator signal and generates a corresponding digital logic clock signal. The clock signal has a given duty cycle with logic levels that change according to a given amplifier bias voltage. The calibration circuit is coupled across the oscillator circuit and changes the amplifier bias voltage by enabling various transistor stages. Changing the amplifier bias voltage proportionally alters the clock signal duty cycle.

The calibration circuit comprises multiple transistor stages that either increase or decrease the amplifier bias voltage. Each transistor stage includes a first and second transistor. Either the first or second transistor can be selectively coupled in parallel with the amplifier. The amplifier and each calibration circuit transistor stage has substantially the same circuit configuration. However, each transistor in the calibration circuit has smaller process parameters than the amplifier transistors. Thus, the amplifier bias voltage is incrementally increased or decreased by activating the appropriate transistor in an appropriate number of transistor stages.

By monitoring the amplifier bias voltage, the calibration circuit determines which transistor and the number of transistor stages to be activated. The initial monitored bias voltage is compared with a reference voltage. Depending upon whether the amplifier bias voltage is above or below the reference voltage, the calibration circuit either activates the first or second transistor in each transistor stage. Successive stages are enabled until the amplifier bias voltage substantially equals the reference voltage. Thus, the invention automatically or selectively alters the oscillator circuit to generate a clock signal with a highly precise duty cycle.

The reference voltage represents a desired amplifier bias voltage that produces a clock signal at the desired duty cycle. Thus, changing the effective amplifier bias voltage to correspond with the reference voltage adjusts the clock signal to provide a desired output response. For example, it may be desirable for the clock signal to have a duty cycle chat is a logic one for the first half of a clock period and is a logic zero for the second half of each clock period (i.e., 50/50 duty cycle). For a power supply voltage $V_{dd}$, an amplifier bias voltage of $V_{dd}/2$ will typically generate a clock signal with a 50/50 duty cycle. Thus, the reference voltage is set at $V_{dd}/2$ and the effective amplifier bias voltage is adjusted until it matches the reference voltage. The reference voltage is programmable allowing the desired output characteristics of the clock signal to be adjusted. For example, the clock signal duty cycle can be adjusted for various circuit applications and operating conditions.

The foregoing and other objects, features and advantages of the invention will become more readily apparent from the following detailed description of a preferred embodiment of the invention which proceeds with reference to the accompanying drawings.

DETAILED DESCRIPTION

Figure 1:
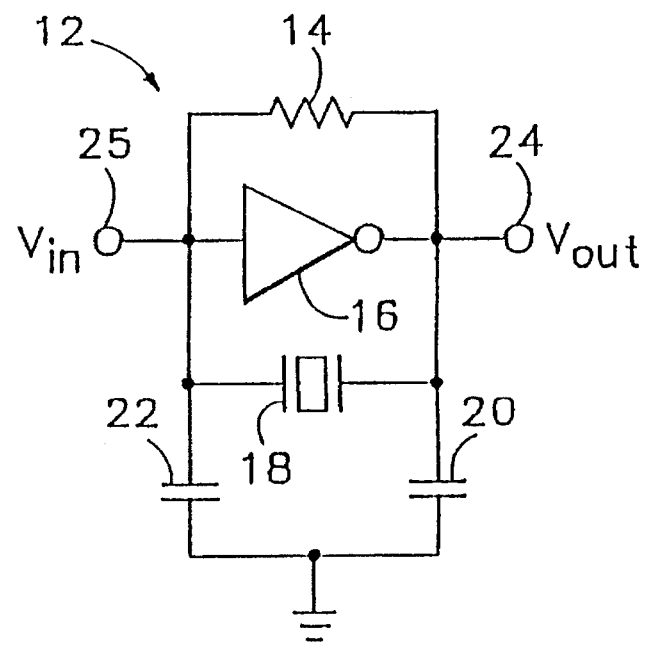
FIG. 1 is a circuit diagram of a prior art Pierce oscillator.

FIG. 1 is a circuit diagram of a prior art Pierce oscillator 12. The Pierce oscillator includes a crystal circuit comprising a crystal 18, capacitor 20, and capacitor 22. A feedback resistor 14 and an invertor 16 are coupled to the crystal circuit between an input terminal 25 and an output terminal 24.

Figure 2:
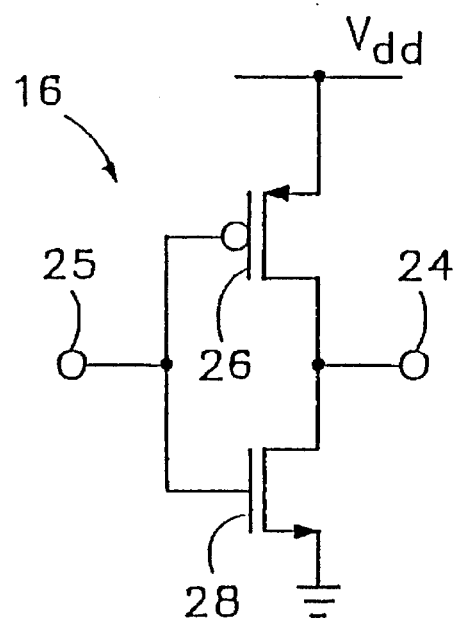
FIG. 2 is a detailed circuit diagram of the invertor shown in FIG. 1.

FIG. 2 is a detailed circuit diagram of the invertor 16 shown in FIG. 1. The invertor includes a p-channel FET 26 and an n-channel FET 28 each coupled at their respective gates to input terminal 25 and coupled at their outputs to terminal 24.

Invertor 16 receives a relatively small periodic signal generated from crystal 18 at input terminal 25 and generates an output voltage ($V_{out}$) at output terminal 24. Invertor 16 acts as an amplifier creating a signal at output terminal 24 with the appropriate digital voltage logic levels to drive digital logic circuitry (not shown) coupled to output terminal 24. Feedback resistor 14 biases the invertor into saturation to achieve maximum gain.

Since invertor 16 operates as a signal amplifier, it must provide maximum gain to effectively translate the crystal oscillator signal at terminal 25 ($V_{in}$) into either a logic one or a logic zero at terminal 24. With higher invertor gain, the output signal at terminal 24 also spends a higher percentage of each clock cycle at one of the two digital logic levels (i.e., logic one or logic zero).

Figure 3:
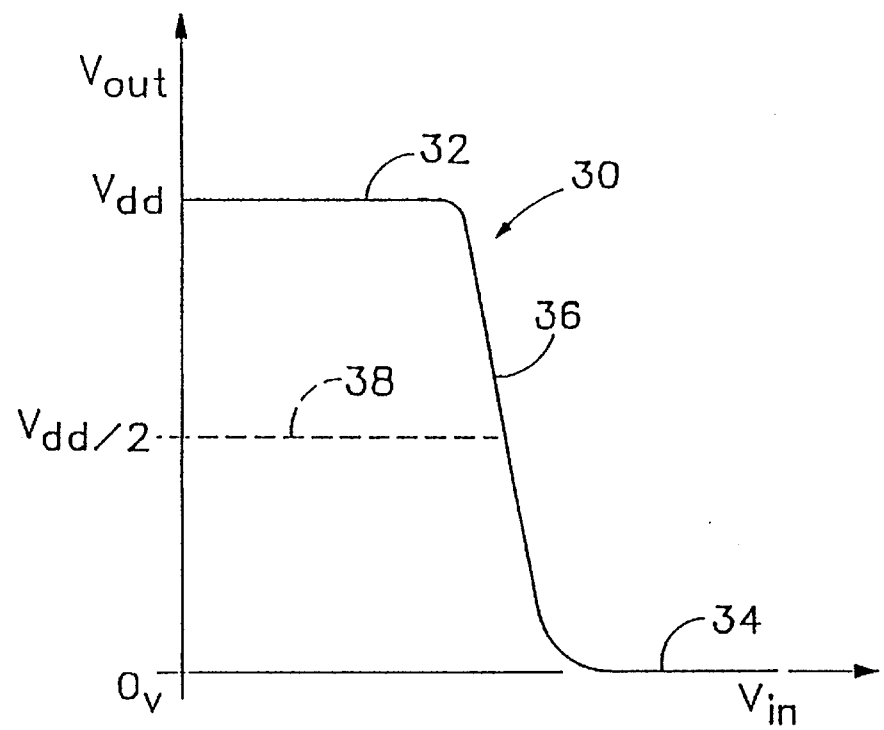
FIG. 3 is the output response for the invertor shown in FIG. 1.

To explain further, FIG. 3 is the output response for invertor 16 shown in FIG. 1. Curve 30 shows that a low input voltage at input terminal 25 (FIG. 1) causes the output voltage ($V_{out}$) at terminal 24 to be substantially equal to the power supply voltage $V_{dd}$ (i.e., logic one), as shown by curve section 32. As the input voltage increases, $V_{out}$ drops to zero volts (i.e., logic zero), as shown by curve section 34. It is desirable to have a steep transition section 36 so that a relatively small input signal from crystal 18 (FIG. 1) can drive the output of invertor 16 to both a logic one and a logic zero level. In addition, a steeper slope in transition section 36 reduces the amount of time the clock signal remains in an unstable transition state.

The slope of curve 30 increases proportionally with the gain of invertor 16. However, with high invertor gain, it is critical that FET 26 and FET 28 (FIG. 2) are evenly matched. If the FETs are not evenly matched, it is likely that the output voltage duty cycle at output terminal 24 will deviate from the intended value. For example, mismatched invertor transistors that have different channel widths, channel lengths, or threshold voltages, alter the invertor bias voltage and correspondingly alter the expected output signal duty cycle. Bias voltage, as used here, refers to the steady state output response of the invertor circuit 16.

Figure 4:
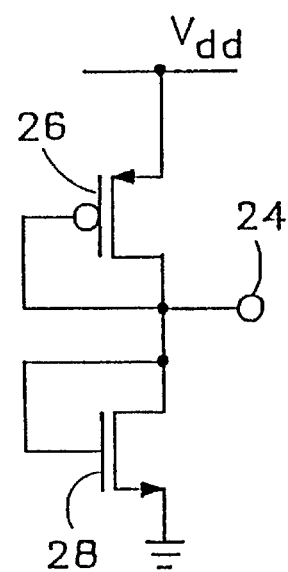
FIG. 4 is a circuit diagram of a voltage divider using two field effect transistors.

The effects of transistor mismatching on the invertor bias voltage is illustrated further in FIG. 4. The term bias voltage is used to define the output response of the invertor 16 when not driven by the input voltage ($V_{in}$) from the crystal circuit (FIG. 1). For example, FIG. 4 shows FETs 26, 28 from the invertor circuit of FIG. 2 reconfigured essentially as a voltage divider. If n-channel transistor 26 and the p-channel transistor 28 are perfectly balanced, for example, if transistors 26 and 28 have the same process parameters, such as equal channel width and channel length, shorting both of the FET gates to their respective drains generate a bias voltage at output terminal 24 of $V_{dd}/2$. This is equivalent to having two resistors of equal size. With equally matched invertor transistors, the output voltage at terminal 24 in FIG. 1 has the desired 50% duty cycle. However, due to IC process variations, the equivalent resistance of both FETs 26 and 28 are often not the same.

Referring back to FIG. 3, the invertor bias voltage, represented by dashed line 38, should be approximately half way between the logic one voltage level and the logic zero voltage level (i.e., $V_{dd}/2$) for a 50/50 duty cycle. However, the invertor bias voltage, and accordingly the duty cycle, can vary from $V_{dd}/2$ if FETs 26 and 28 in FIG. 2 are not evenly matched.

A higher bias voltage generates a higher duty cycle (i.e., the output voltage remains at a logic one voltage level for a greater percentage of each clock period). Alternatively, if the bias voltage is lower than $V_{dd}/2$ (e.g., dashed line 38 is at a lower voltage), $V_{out}$ will have a lower duty cycle. Thus, any process mismatches between the FETs 26 and 28 in invertor 16 (FIG. 1) change the duty cycle of the output voltage at output terminal 24. Process mismatches in oscillator circuits are particularly problematic in overtone crystals operating at high frequencies. If there is not good matching between the amplifier circuit and the corresponding crystal circuit, the duty cycle can change significantly from what was originally intended.

Figure 5:
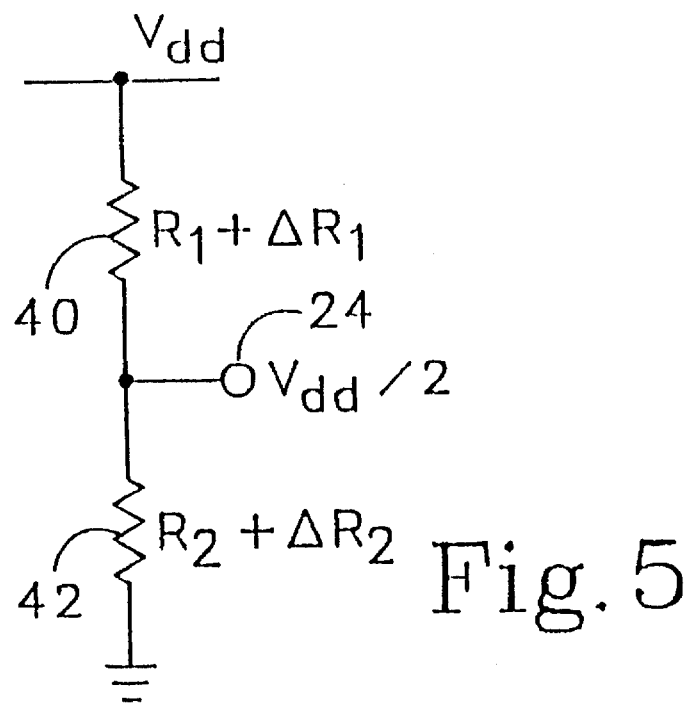
FIG. 5 is a circuit diagram representing the invertor circuit shown in FIG. 2 with an altered bias voltage.

FIG. 5 is a resistor circuit representing the impedance of invertor 16 shown in FIG. 2 with an adjusted bias voltage. To correct for process mismatches between the transistors in invertor 16, the effective process parameters for one of the transistors is altered. For example, $R_1$ represents the impedance of FET 26 and $R_2$ represents the impedance of FET 28. If $R_1$ and $R_2$ are not equal, additional impedance is added to FET 26 (i.e., $\Delta R_1$) or to FET 28 (i.e., $\Delta R_2$) until the effective overall impedance 40 of FET 26 is equal to the overall impedance 42 of FET 28. By matching impedance 40 and 42, the bias voltage at terminal 24 moves to $V_{dd}/2$.

To create a controllable $\Delta R_1$ and $\Delta R_2$ that are used to effectively match the process parameters of FETs 26 and 28, multiple transistor stages are selectively coupled across FET 26 and FET 28 (FIG. 2) as described further below.

Figure 6:
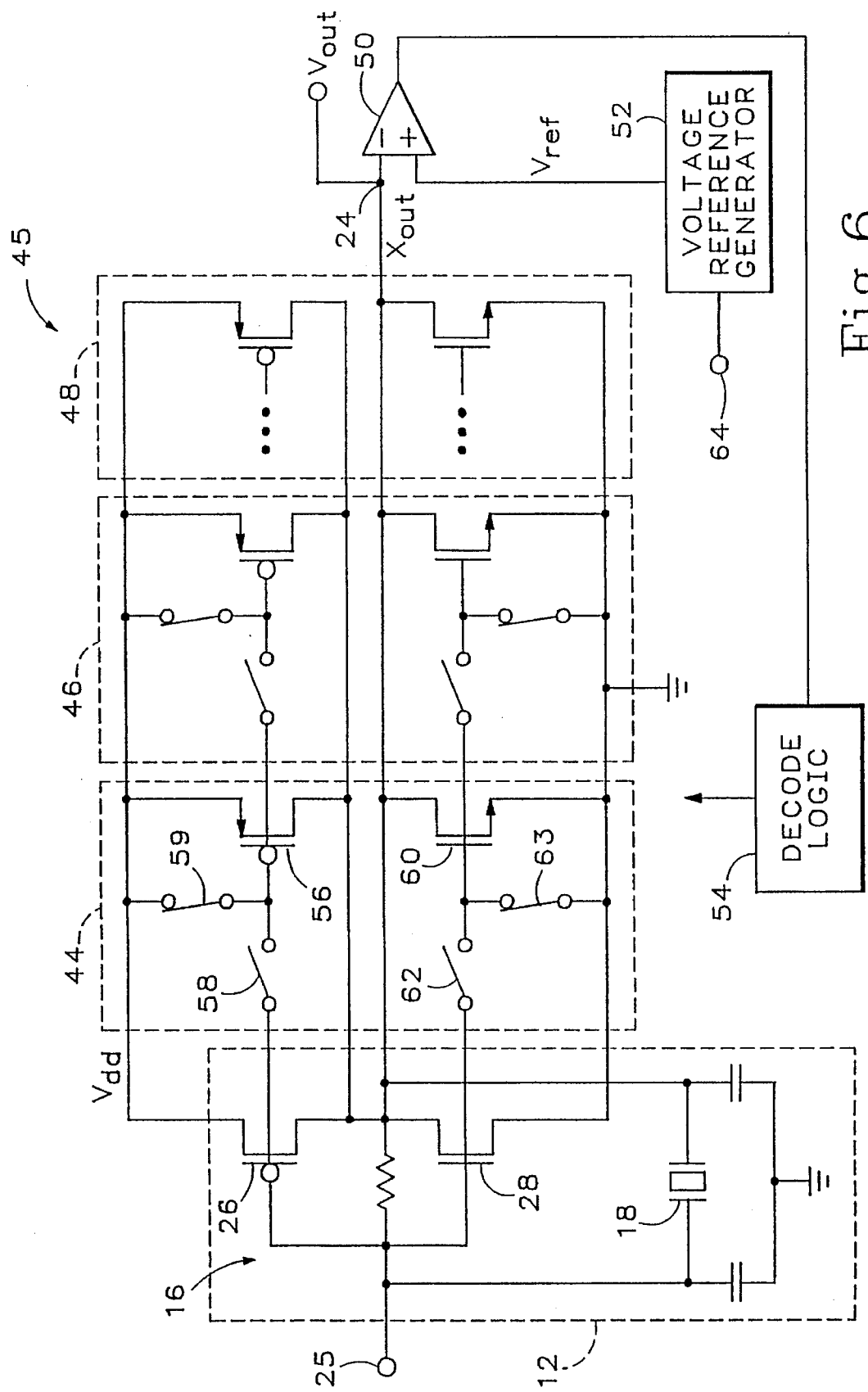
FIG. 6 is a circuit diagram of a duty cycle control circuit according to the invention.

FIG. 6 is a circuit diagram showing an oscillator circuit with an adjustable duty cycle according to the invention. The oscillator circuit 12, previously shown in FIG. 1, is coupled at the input terminal 25 and at output terminal 24 to a duty cycle control circuit 45. The oscillator circuit 12 is shown with FETs 26 and 28 (i.e., invertor 16 in FIG. 1). The duty cycle control circuit 45 comprises transistor stages 44, 46, 48, a voltage reference generator 52, comparator 50, and decode logic 54.

Comparator 50 receives the output signal ($V_{out}$) from oscillator circuit 12 and a desired voltage reference signal ($V_{ref}$) from voltage reference generator 52. The comparator 50 supplies an output control signal to decode logic circuit 54. The decode logic 54 selectively couples various transistor stages 44, 46 and 48 to oscillator circuit 12. The calibration circuit is coupled to the oscillator circuit 12 to control the value of $X_{out}$ at terminal 24.

It is important to note that $X_{out}$ refers to the bias voltage from invertor 16 with either no input signal or a predetermined input signal at input terminal 25. Alternatively, $V_{out}$ refers to the output voltage provided by the invertor 16 after being fed an input signal from crystal 18 at terminal 25. Thus, $X_{out}$ is adjusted prior to activating crystal 18 so that the output voltage $V_{out}$ has a desired duty cycle.

Each transistor stage 44, 46, and 48 can either increase or decrease the invertor bias voltage effectively altering the duty cycle of $V_{out}$. Referring to transistor stage 44, a p-channel transistor 56 is selectively coupled by switch 58 to increase $X_{out}$ and an n-channel transistor 60 is selectively coupled by switch 62 to input terminal 25 to decrease $X_{out}$. Each transistor stage in the control circuit has substantially the same circuit configuration as invertor 16. However, FETs 56 and 60 have smaller process parameters than corresponding FETs 26 and 28 in invertor 16. These smaller process parameters in each transistor stage allow small incremental changes to be made to $X_{out}$.

Figure 7:
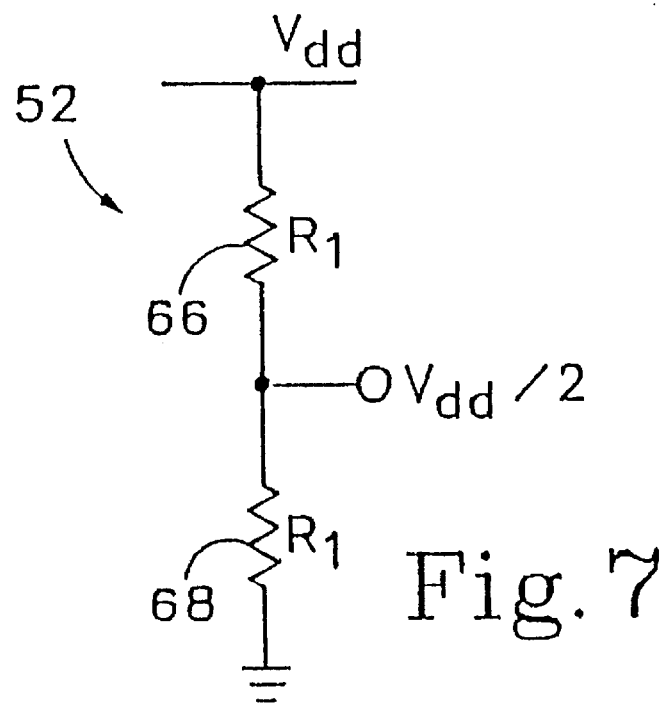
FIG. 7 is a circuit diagram of the voltage reference generator shown in FIG. 6

As described above, comparator 50 compares $X_{out}$ with a desired voltage reference $V_{ref}$ output from voltage reference generator 52. FIG. 7 is one example of a simple voltage divider circuit that provides the desired reference voltage $V_{dd}/2$ at the output of voltage reference generator 52. In one embodiment of circuit 52, polysilicon resistors 66 and 68 are matched to within 0.1% to generate a high precision voltage reference $V_{ref}$.

Alternatively, the voltage reference generator comprises a digital-to-analog converter that selectively alters $V_{ref}$ according to an input signal from an external controller (not shown). The controller, such as a microprocessor, is attached to the voltage reference generator at terminal 64.

The decode logic 54 receives the output control signal from comparator 50 and accordingly connects or disconnects switches 58, 59, 62, and 63 in each transistor stage. Decode logic 54 is typically a ring oscillator or a state machine. For example, decode logic 54 will enable either FET 56 or FET 60 in stage 44 and then wait a certain amount of time to determine the new status of $X_{out}$. Then, if necessary, decode logic 54 enables additional transistors in transistor stages 46 and 48 until $X_{out}$ is substantially equal to $V_{out}$. Alternatively, the decode logic can be designed to determine the voltage difference between $X_{out}$ and $V_{ref}$ and enable the appropriate number of transistor stages at one time. Implementation of the decode logic is a design detail that would be known to those skilled in the art.

In one embodiment of the invention, if $X_{out}$ is higher than $V_{ref}$, decode logic 54 opens normally closed switch 63 and closes normally open switch 62. Thus, n-channel FET 60 is effectively coupled in parallel with FET 28 from invertor 16. Enabling FET 60 reduces $X_{out}$ at terminal 24 thereby adjusting the effective operating characteristics of FET 28 to more closely match the operating characteristics of FET 26. If $X_{out}$ is still greater than $V_{ref}$ after enabling FET 60, decode logic 54 enables the next n-channel FET from transistor stage 46. Additional n-channel FETs from transistor stage 48, etc. are enabled until $X_{out}$ is substantially equal to $V_{ref}$.

Alternatively, if $X_{out}$ is less than $V_{ref}$, decode logic 54 enables p-channel FET 56 by opening normally closed switch 59 and closing normally open switch 58 in transistor stage 44. Thus, FET 56 is coupled in parallel with FET 26. FET 56 in conjunction with invertor FET 26 more closely match the operating characteristics of FET 26 than FET 26 operating alone. Accordingly, additional p-channel FETs from transistor stages 46, 48, etc., can be enabled until $X_{out}$ is substantially equal to $V_{ref}$.

Thus, the multiple transistor stages 44, 46, and 48 are used to match the process parameters of invertor FETs 26 and 28. It is important to note that each transistor stage is used to compensate for any process variation between FET 26 and FET 28. For example, process variations can create different channel widths, channel lengths, or threshold voltages in each invertor FET. Since $X_{out}$ is altered until it reaches the ideal output response $V_{ref}$, the duty cycle control system in FIG. 6 corrects for any IC process variation that may alter the desired response of the output signal generated by oscillator circuit 12.

Figure 8:
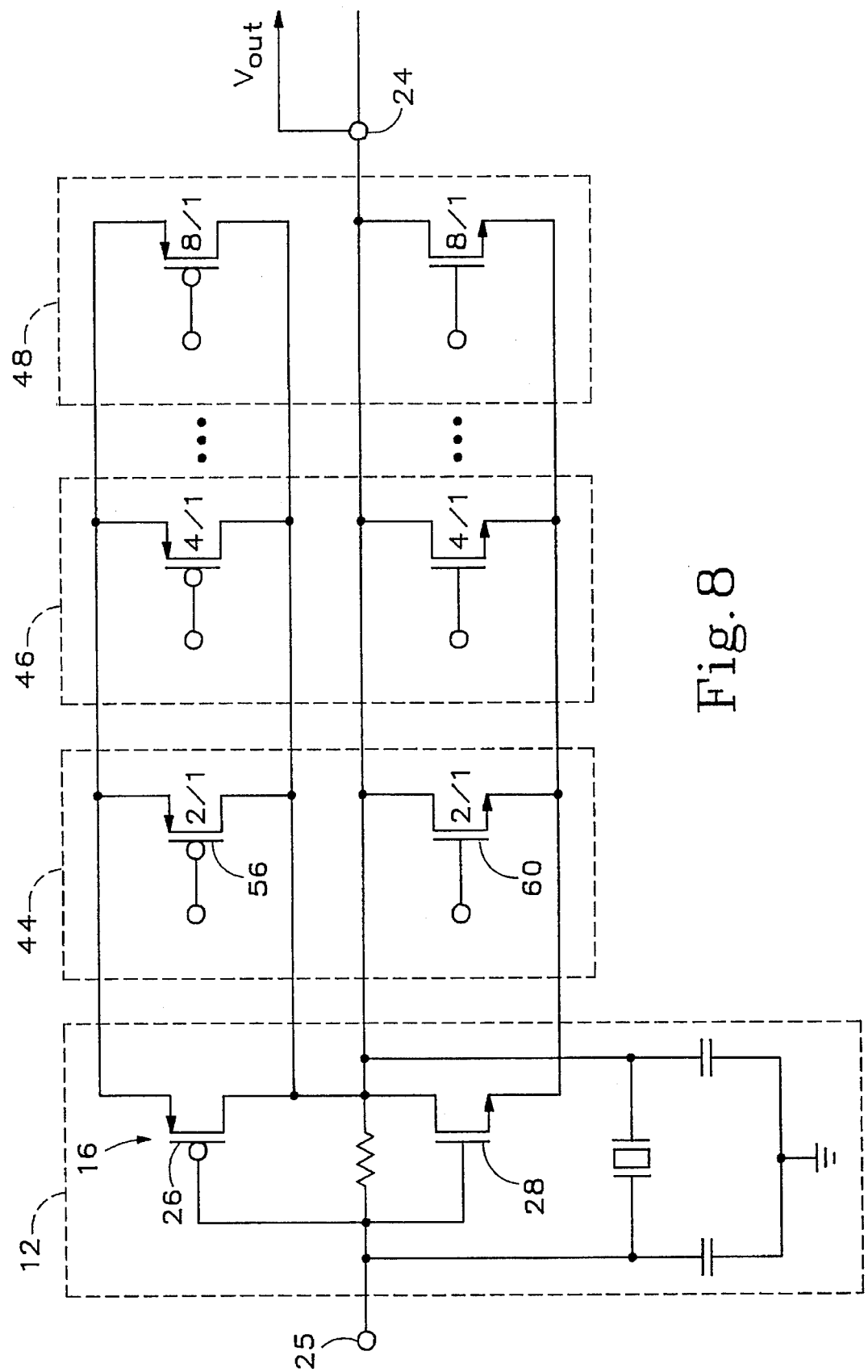
FIG. 8 is a circuit diagram of the duty cycle control circuit shown in FIG. 6 with binary transistor process parameters.

The process parameters of each transistor in each transistor stage 44, 46, 48, etc., can be fabricated to change $X_{out}$ in various quantities. For example, a binary weighted code allows each subsequent transistor stage to change $X_{out}$ in subsequently smaller increments. FIG. 8 is the circuit diagram shown in FIG. 6 with binary weighted transistor stages. Transistors 56 and 60 each have a 2 micrometer (um) channel width and a 1 um channel length (i.e., 2/1 channel ratio). The transistors in stage 44 have a 4/1 channel ratio (i.e., 4 um channel width/1 um channel length) and transistor stage has a 8/1 channel ratio.

Thus, each transistor stage provides a higher level of process control that make proportionately smaller changes to $X_{out}$. Alternatively, each transistor stage can have the same channel ratio or any combination that is most effect to match the process technology of the given oscillator circuit. The process characteristics for each transistor in each transistor stage depend upon the precision required in matching the invertor FETs 26 and 28. For example, if the transistors in the invertor had a 100 milli-amp (ma) maximum operating current, the calibration transistors could be some smaller size such as a transistor having a 0.2 ma maximum operating current.

The circuit in FIG. 6 can also be used to selectively program the duty cycle of $X_{out}$ as opposed to the transition matching procedure described above. Previously, it was described how the duty cycle control circuit in FIG. 6 was used to match the transistors in invertor 16 to generate, for example, a 50% duty cycle. However, the duty cycle control circuit can also be used to select different duty cycles. For example, if $V_{out}$ presently has a 50/50 duty cycle, additional p-channel FETs 56 (FIG. 6) can be enabled to increase the duty cycle of $V_{out}$ (e.g., 55/45).

Altering the duty cycle is performed by simply increasing or decreasing $V_{ref}$. Accordingly, the decode logic 54 will enable transistor stages until $X_{out}$ reaches the new reference voltage. Thus, the effective amplifier bias voltage $X_{out}$ changes creating corresponding changes to the duty cycle of $V_{out}$. For the circuit shown in FIG. 6, increasing $V_{ref}$ increases the duty cycle of $V_{out}$ and reducing $V_{ref}$ reduces the duty cycle of $V_{out}$.

The calibration circuit in FIG. 6 normally operates during each IC power up sequence. However, the system can be externally enabled, for example, via a register bit in decode logic 54. Thus, an external microprocessor (not shown) can initiate a calibration procedure for $V_{out}$ according to various external input stimuli (e.g., temperature). The calibration circuit is simple enough to be put in a pad cell on the side of an IC chip.

The circuit shown in FIG. 6 operates in the following manner. During initial circuit start-up, crystal 18 is prevented from supplying an alternating input signal to input terminal 25. For example, a predetermined voltage is set at input terminal 25. The desired reference voltage $V_{ref}$ is then supplied by voltage reference generator 52. Decode logic circuit 54 is enabled and duty cycle control circuit 45 measures the bias voltage $X_{out}$ at the inverting input of comparator 50. The bias voltage $X_{out}$ is altered as described above until it is substantially the same as $V_{ref}$.

At this point, the bias voltage $X_{out}$ of invertor 16 is at a value that will provide a desired duty cycle for $V_{out}$. Crystal 18 is then enabled, for example, by removing the external signal at input terminal 25 or by a switching circuit. Crystal 18 then provides a signal at input terminal 25 that drives invertor 16 and provides an output signal $V_{out}$ with the desired duty cycle.

Having described and illustrated the principles of the invention in a preferred embodiment thereof, it should be apparent that the invention can be modified in arrangement and detail without departing from such principles.

I claim all modifications and variation coming within the spirit and scope of the following claims.

1. An oscillator control system comprising:

an oscillator for generating a repetitive activation signal including an amplifier circuit having an input for receiving the repetitive activation signal and an output for providing a digital logic timing signal with a timing signal duty cycle, the amplifier circuit having a bias voltage; and a control circuit, responsive to the amplifier bias voltage, including multiple selectable transistor stages for both switchably increasing and switchably decreasing the amplifier bias voltage and coupled to the amplifier circuit for controlling the timing signal duty cycle according to the amplifier bias voltage.

2. The oscillator control system according to claim 1 wherein each said multiple selectable transistor stage includes a first and second transistor each selectively coupled in parallel with the amplifier, the first transistor for increasing the amplifier circuit bias voltage and the second transistor for decreasing the amplifier bias voltage.

3. The oscillator control system according to claim 1 wherein the amplifier circuit and each said multiple selectable transistor stage has substantially the same circuit configuration, each said multiple selectable transistor stage having a smaller bias voltage than the amplifier circuit.

4. The oscillator control system according to claim 1 wherein the control circuit includes means for monitoring the amplifier bias voltage.

5. The oscillator control system according to claim 4 wherein the means for monitoring the amplifier bias voltage comprise a comparator that compares the amplifier bias voltage to a voltage reference.

6. The oscillator control system according to claim 5 wherein the voltage reference is programmable for selectively changing the timing signal duty cycle.

7. The oscillator control system according to claim 1 wherein the control circuit includes decode logic that adjusts the amplifier bias voltage in a predefined sequence.

8. A system for changing output characteristics of a timing signal, comprising:

a signal generator including an amplifier and having a steady state output response, at an output of the signal generator and capable of generating a digital timing signal with a given duty cycle;

a monitor circuit coupled to the output of the signal generator for monitoring the steady state output response; and a control circuit including multiple transistor stages selectively coupled to the amplifier and coupled across the signal generator for varying the duty cycle of the digital timing signal according to the monitored steady state response from the monitor circuit.

9. The system according to claim 8 wherein the signal generator comprises a crystal oscillator circuit coupled to the amplifier, the amplifier including a first and second transistor each having an input coupled together to receive a repetitive signal from the crystal oscillator and an output coupled together to form the signal generator output.

10. The system according to claim 9 wherein the first transistor comprises a p-channel FET and the second transistor comprises an n-channel FET and the control circuit comprises an array of selectable n-channel FETs coupled in parallel with the amplifier n-channel FET and an array of selectable p-channel FETs coupled in parallel with the amplifier p-channel FET.

11. The system according to claim 9 wherein each stage of the multiple transistor stages selectively coupled across the amplifier have substantially the same circuit configuration as the amplifier.

12. The system according to claim 11 wherein each said multiple selectable transistor in the amplifier and in each transistor stage has a given set of process parameters for controlling the functional characteristics of the transistor, each transistor in the control circuit having smaller process parameters than the amplifier transistors so that the amplifier bias voltage can be incrementally increased or decreased to produce an output signal with a high precision duty cycle.

13. The system according to claim 8 wherein the monitor circuit includes a comparator and a reference voltage generator, the comparator coupled to the reference voltage generator and the signal generator output and generating an output fed to the control circuit to vary the digital timing signal duty cycle.

14. The system according to claim 13 wherein the monitor circuit includes a decode logic circuit coupled between the comparator and the control circuit for systematically changing the digital timing signal duty cycle.

15. The system according to claim 13 wherein the reference voltage generator is programmable for selectively changing the digital timing signal duty cycle.

16. The system according to claim 8 wherein the signal generator comprises a Pierce oscillator.

17. A method for controlling output characteristics of a digital timing signal, comprising:

providing an amplifier for converting a crystal oscillator signal into a timing signal with distinct digital logic levels and a given duty cycle, the amplifier circuit having a bias voltage and the duty cycle of the timing signal changing according to a given amplifier output voltage;

measuring the amplifier output voltage; and changing the amplifier output voltage by switchably increasing and switchably decreasing the amplifier bias voltage until the timing signal reaches a predetermined duty cycle.

18. The method according to claim 17 further comprising the steps of:

selecting at least one of first and second transistors with predetermined operating characteristics to vary the timing signal duty cycle; and matching the operating characteristics of the first and second transistors.

19. The method according to claim 17 wherein the step of providing an amplifier further comprises the step of providing the amplifier with first and second transistors each having a given set of operating characteristics and wherein the step of changing the amplifier output voltage further comprises the step of switchably matching the operating characteristics of the first and second transistors.

20. An oscillator control system comprising:

a programmable voltage reference for selectively changing the duty cycle of a digital logic timing signal;

an oscillator for generating a repetitive activation signal including an amplifier circuit having an input for receiving the repetitive activation signal and an output for providing the digital logic timing signal, the amplifier circuit having a bias voltage; and a control circuit including a comparator that compares the amplifier bias voltage to the voltage from the programmable voltage reference for monitoring the amplifier bias voltage, decode logic that adjusts the amplifier bias voltage in a predefined sequence, and multiple selectable transistor stages, each said multiple selectable transistor stage including a first and second transistor each selectively coupled in parallel with the amplifier, the first transistor for increasing the amplifier circuit bias voltage and the second transistor for decreasing the amplifier bias voltage, thereby controlling the duty cycle of the digital logic timing signal according to the amplifier bias voltage.

* * * * *